(12) United States Patent
Kwark

(10) Patent No.: US 6,602,078 B2
(45) Date of Patent: Aug. 5, 2003

(54) ELECTRICAL INTERCONNECT HAVING A MULTI-LAYER CIRCUIT BOARD STRUCTURE AND INCLUDING A CONDUCTIVE SPACER FOR IMPEDANCE MATCHING

(75) Inventor: Bongsin Kwark, Irvine, CA (US)

(73) Assignee: Cenix, Inc., Allentown, PA (US)

( * ) Notice: Subject to any disclaimer, the term of this patent is extended or adjusted under 35 U.S.C. 154(b) by 0 days.

(21) Appl. No.: 10/100,512

(22) Filed: Mar. 18, 2002

(65) Prior Publication Data

US 2002/0139579 A1 Oct. 3, 2002

Related U.S. Application Data

(60) Provisional application No. 60/276,207, filed on Mar. 16, 2001.

(51) Int. Cl.[7] .............................................. H01R 12/00
(52) U.S. Cl. ........................................ 439/66; 361/792
(58) Field of Search .............................. 439/55, 65, 66; 174/250, 255; 361/790, 792, 795

(56) References Cited

U.S. PATENT DOCUMENTS

| | | | | |
|---|---|---|---|---|
| 4,667,220 A | * | 5/1987 | Lee et al. | |
| 5,302,923 A | * | 4/1994 | Mason et al. | 333/33 |
| 5,331,514 A | * | 7/1994 | Kuroda | 361/792 |
| 5,912,809 A | * | 6/1999 | Steigerwald et al. | 361/780 |
| 6,407,343 B1 | * | 6/2002 | Tanaka | 174/261 |

* cited by examiner

*Primary Examiner*—Khiem Nguyen
(74) *Attorney, Agent, or Firm*—Volentine Francos, PLLC

(57) ABSTRACT

An electrical interconnect having a multi-layer circuit board structure is designed to facilitate source and load impedance matching. The circuit board structure has a first transmission line extending along a surface of one of the layers, and a second transmission line extending along a surface of another of the layers. A signal line connects the first transmission line to the second transmission line in the vertical direction of the circuit board structure. A conductive ground spacer is interposed between respective layers of the circuit board structure and has a through-hole in which the signal line resides. A dielectric medium, such as air, occupies the through-hole and substantially circumferentially surrounds the signal line. Accordingly, the ground conductor, the signal line and the dielectric medium form a coaxial structure in the vertical direction, by which it is easy to provide a desired characteristic impedance.

10 Claims, 2 Drawing Sheets

ELECTRICAL INTERCONNECT HAVING A MULTI-LAYER CIRCUIT BOARD STRUCTURE AND INCLUDING A CONDUCTIVE SPACER FOR IMPEDANCE MATCHING

CROSS-REFERENCE TO RELATED APPLICATIONS

The present application claims priority under 35 USC §119(e) from U.S. Provisional Application Serial No. 60/276,207, filed Mar. 16, 2001. The disclosure of this provisional application is specifically incorporated herein by reference and for all purposes.

FIELD OF THE INVENTION

The present invention relates generally to a high-speed electrical interconnection. More particularly, the present invention relates to providing impedance matching between electrical circuits.

BACKGROUND OF THE INVENTION

The increasing demand for high-speed voice and data communications has led to an increased reliance on optical communications, particularly optical fiber communications. The use of optical signals as a vehicle to carry information at high speeds is preferred in many instances. Advantages of optical media are, among others, higher bandwidth, greater immunity to electromagnetic interference, and lower propagation loss. In fact, it is common for high-speed optical communication systems to have signal rates in the range of approximately several gigabits per second (Gbit/sec) to approximately several tens of gigabits per second (Gbit/sec), and higher. However, although an optical communication system is useful for transmitting information at high speeds, optical signals ultimately have to be converted to electrical signals (and visa-versa, which are relatively high frequency electrical signals. As such, an electrical interface is required between the optical devices and any electrical devices.

One such structure used in high-frequency electrical applications is the multi-layer circuit board. Multi-layer circuit boards are often used in microwave, rf, millimeter wave, and other high-frequency applications. These structures offer the advantage of a reduced overall area, which facilitates attaining a desired degree of integration/miniaturization. Additionally, multi-layer circuit boards have been generally accepted in the high-speed communications industry because of their relatively low cost and high performance.

As is known, the isolation of signal lines and impedance matching are important characteristics of an electrical interconnect. To wit, the electrical interconnection must foster the isolation of signals, and must foster impedance matching, if it is to offer high performance. That this end, poor isolation between signal lines can result in undesired cross-talk. Moreover, poor impedance matching between signal lines can result in undesired back reflections, and may ultimately affect performance due to increased insertion losses, for example.

Conventional high-speed connectors, namely RF connectors such as SMA-type connectors, have been used to improve impedance matching. Although such an interconnection scheme may provide good performance in high frequency electrical applications, it does not allow for sufficient freedom in attaining higher degrees of integration/miniaturization.

SUMMARY OF THE INVENTION

It is an object of the present invention to provide an electrical interconnect having a multi-layer circuit board structure, wherein the source and load impedances are substantially matched.

It is a further object of the present invention to provide an electrical interconnect for two high speed signal lines which may be one two different multi-layer circuit boards.

To achieve these and other objects, the electrical interconnect includes a signal line that vertically connects a first transmission line extending along the surface of one of the layers of the multi-layer circuit board structure to a second transmission line extending along the surface of another of the layers of the multi-layer circuit board structure, an electrically conductive spacer that substantially circumferentially surrounds the signal line, and a dielectric medium interposed between the signal line and the electrically conductive spacer. The electrical interconnect thus has a structure resembling a coaxial transmission line, in the vertical (thickness) direction of the multi-layer circuit board structure.

The desired characteristic impedance can be provided by selecting appropriate dimensions for the electrically conductive spacer, and by providing a medium having a given dielectric constant around the signal line.

BRIEF DESCRIPTION OF THE DRAWINGS

The invention is best understood from the following detailed description when read with the accompanying drawing figures. It is emphasized that the various features are not necessarily drawn to scale. In fact, the dimensions may be arbitrarily increased or decreased for clarity of discussion. In addition, it is noted that like reference numerals are used to designate like elements throughout the drawings.

DETAILED DESCRIPTION

Figure 2:
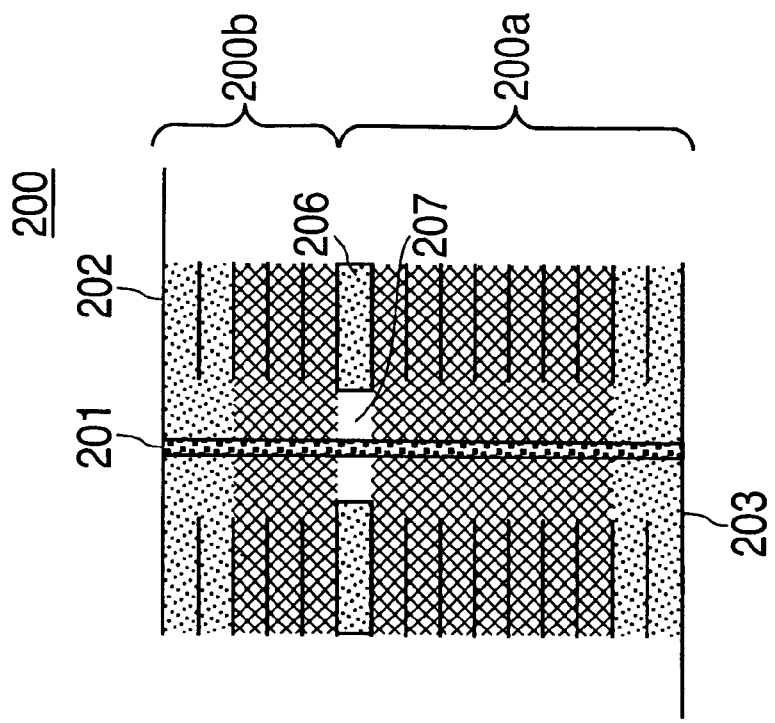
FIG. 2 is a cross-sectional view of a second exemplary embodiment of an electrical interconnect according to the present invention.

In the following detailed description, for purposes of explanation and not limitation, exemplary embodiments disclosing specific details are set forth in order to provide a thorough understanding of the present invention. However, it will be apparent to one having ordinary skill in the art having had the benefit of the present disclosure, that the present invention may be practiced in other embodiments that depart from the specific details disclosed herein. Moreover, descriptions of well-known devices, methods and materials may be omitted so as to not obscure the description of the present invention.

Turning now to FIG. 1 and FIGS. 3–6, an electrical interconnect 100 according to an illustrative embodiment of the present invention comprises a circuit board structure having multiple layers. These layers may include an uppermost signal layer 100a, a bottommost signal layer 100b, top and bottom ground layers 100c, and a plurality of inner ground layers 100d. Each of the layers is made up of a substrate, and a wiring pattern extending along at least one surface of the substrate, as is known per se in the printed wiring board (PWB) art.

The electrical interconnect 100 also has a first signal transmission line 102 constituted by the wiring pattern extending along the outer surface of the uppermost signal layer 100a, and a second signal transmission line 103 constituted by the wiring pattern extending along the outer surface of the bottommost signal layer 100b. The signal transmission lines 102, 103 form respective signal paths or traces along which electrical signals travel to and from the high speed port, respectively, whereby the interconnect may serve as an interface between respective devices. These traces may be of a stripline, microstripline, planar waveguide transmission line, or other type of transmission line within the purview of one of ordinary skill in the art.

A signal line in the form of a high speed pin 101 is used to connect the first transmission line 102 to the second transmission line 103. More specifically, the signal line 101 extends vertically through the circuit board structure so as to connect the first and second transmission lines 102, 103. It is noted that the vertical orientation of the signal line 101 is merely illustrative; it may have other orientations relative to the signal transmission lines, depending on the relative orientation thereof.

Figure 1:
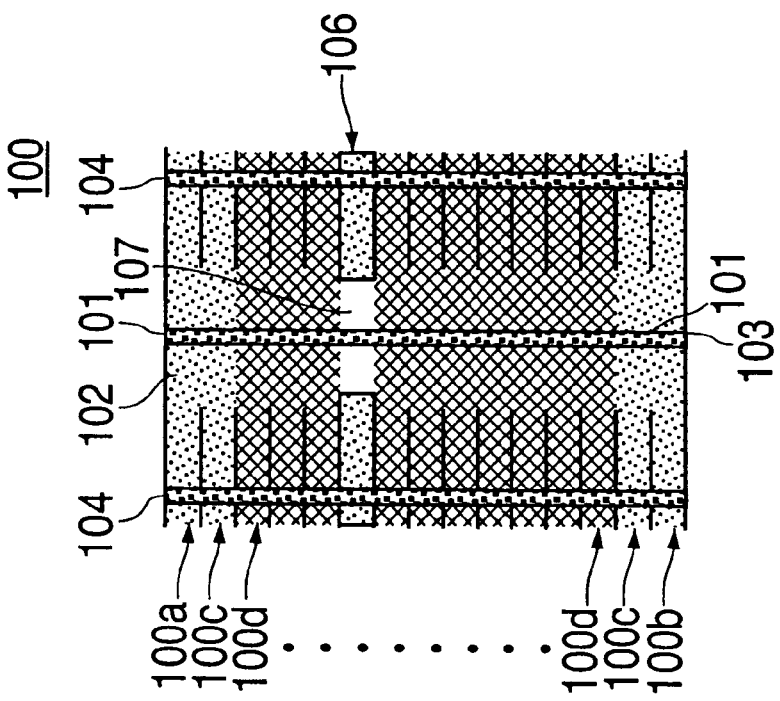
FIG. 1 is a cross-sectional view of a first exemplary embodiment of an electrical interconnect according to the present invention.
Figure 5:
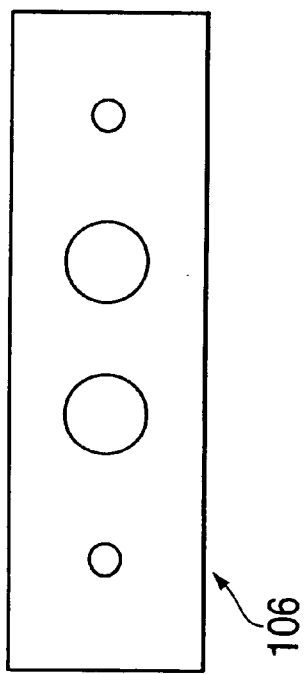
FIG. 5. is a plan view of a conductive ground of the first exemplary embodiment of the electrical interconnect according to the present invention.
Figure 6:
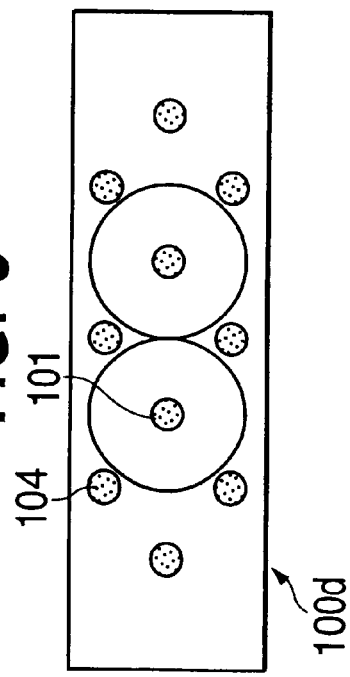
FIG. 6 is a plan view of an inner ground layer of the first exemplary embodiment of the electrical interconnect according to the present invention.
Figure 3:
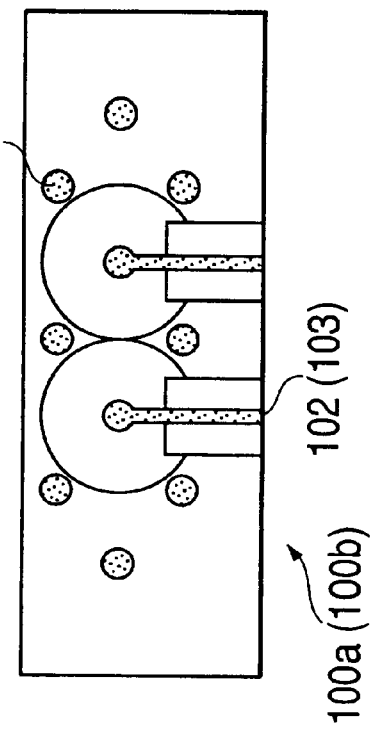
FIG. 3 is a plan view of a signal layer (upper or lower) of the first exemplary embodiment of the electrical interconnect according to the present invention.
Figure 4:
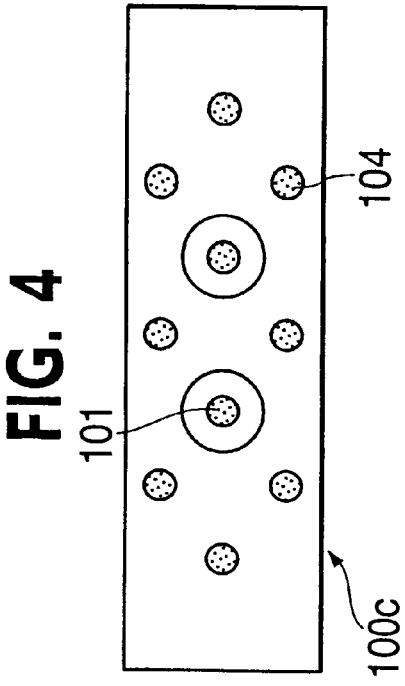
FIG. 4 is a plan view of a ground layer (uppermost or lowermost) of the first exemplary embodiment of the electrical interconnect according to the present invention.

A plurality of ground vias 104 in the form of pins are disposed about the signal line 101. In addition, an electrical ground spacer 106 is interposed between respective ones of the inner ground layers 100d of the circuit board structure at a location intermediate the layers 100a, 100b having the first and second transmission lines 102, 103. As is shown in FIG. 1, the electrical ground spacer 106 is in contact with the ground wiring patterns of the surrounding inner ground layers 100d.

Furthermore, the electrical ground spacer 106 has a substantial thickness such that it spaces the two inner ground layers 100d, 100d from one another. Accordingly, the electrical ground spacer will be referred to hereinafter as conductive spacer 106.

The conductive spacer 106 is made of copper, for example, and substantially surrounds the signal line 101 in a circumferential manner. In particular, the conductive spacer 106 has a through-hole in which the signal line 101 resides as spaced therefrom. The diameter of the through-hole may be 50 mm, for example. In any case, the conductive spacer 106 is substantially thicker than the wiring patterns of any of the layers of the circuit board structure for reasons that will become clearer below. In fact, the conductive spacer 106 has a thickness that is substantially the same as that of the layers of the circuit board structure. For instance, the thickness of the conductive spacer is about 80 mm.

A dielectric medium 107 occupies the through-hole in the conductive spacer 106. In the present exemplary embodiment, the dielectric medium is a volume of air (index of refraction, $n_r=1$) and substantially circumferentially surrounds signal lines 101. However other dielectric materials may be used. As is shown in the figure, only the signal line 101 resides in the area occupied by the dielectric medium 107.

In the embodiment of FIG. 1, the circuit board structure consists of a single multi-layer printed circuit board in which the conductive spacer 106 is integrated. In this case, the transmission lines 102 and 103 are disposed on one multi-layer circuit board. Alternatively, the first and second transmission signal lines may be disposed on two distinct or discrete multi-layer circuit boards (MLB), respectively.

In the electrical interconnect 200 shown in FIG. 2, the circuit board structure comprises two discrete printed circuit boards, illustratively, a mother board 200a (test board) and daughter board 200b. Similar to the first embodiment, a signal line 201 is used to connect a first signal transmission line 202 to a second signal transmission line 203. Also, a conductive spacer 206 of copper, for example, substantially circumferentially surrounds the signal line 201. The conductive spacer 206 has a through-hole in which the signal line 201 resides as spaced therefrom. A dielectric medium 207 occupies the through-hole in the conductive spacer 206. Illustratively, as was the case with the exemplary embodiment described above, the dielectric medium is a volume of air.

In the embodiments described above, the transmission lines that are connected by the signal line are located along the outer surfaces of the uppermost and lowermost layers of the printed circuit board structure. However, the transmission lines may be located at any two different levels of a multi-layer circuit board (MLB) or boards.

Next, the operation of the electrical interconnect according to the present invention will be described. According to the present invention, a ground plane is used to substantially surround a high-speed signal pin (for example, signal line 101 or 201). Thus, the interconnect has a coaxial structure in the vertical direction, i.e., the ground plane and signal line replicate a coaxial signal transmission line. The impedance of the interconnection (also referred to herein as the via) can thus be controlled to have a desired characteristic impedance. Now, the given characteristic impedance $Z_0$ for a coaxial structure can be calculated from the following equation:

$$Z_0 = (60/\sqrt{\epsilon_r}) \ln(b/a) \quad (1)$$

wherein $\epsilon_r$ is the dielectric constant of the material between the two conductors, b is the diameter of the outer conductive material, and a is the diameter of the inner conductive material.

It is noted that the parameter b is illustratively the diameter of the through-hole in the conductive spacer 106, 206. It is further noted that the parameter b may also represent the outer circle of 100d inside the multi-layer substrate shown in FIG. 6. Accordingly, the same parameter may yield different values for b because of the different dielectric constants (Er); the former being the relative permittivity for air (i.e., 1), and the latter being that of the substrate material.

The electrical interconnect of the present invention can be designed to provide the desired characteristic impedance, i.e., an impedance that matches the source and load impedance, by sizing the elements of the interconnect according to equation (1). For example, the characteristic impedance of the electrical interconnect of the present invention satisfies equation (1) wherein is the dielectric constant of the dielectric medium 107 or 207, b is the diameter of the ground plane, and a is the diameter of the signal pin (or via) 101 or 201.

In summary then, according to the present invention, an air gap or other dielectric, in which only the via resides, is provided between the via and a ground plane. The ground plane is formed by a conductive ground located between the layers of a single multi-layer circuit board or between two boards. Thus, the dielectric, the via and the ground plane form a coaxial signal transmission line structure. When the air gap is used, the dielectric constant $\epsilon_r$ of the structure is 1.0. By virtue of the structure of the present invention, impedance matching of can be provided, e.g. a characteristic impedance of 50 Ω can be provided, and reflection at discontinuities can thereby be minimized.

Finally, although the present invention has been described above with respect to the exemplary embodiments thereof, various changes to and modifications of these embodiments will become apparent to those skilled in the art. Therefore, the true spirit of the present invention is seen to encompass all such changes and modifications that come within the scope of the appended claims.

What is claimed:

1. An electrical interconnect comprising:

circuit board structure having multiple layers each including a substrate and a wiring pattern extending along at least one surface of the substrate, and the circuit board structure having a first transmission line constituted by the wiring pattern extending along a surface of one of said layers, and a second transmission line constituted by the wiring pattern extending along a surface of another of said layers;

a signal line extending from said first transmission line to said second transmission line in a vertical direction through said circuit board structure so as to form an electrical interconnection of said transmission lines;

an electrical ground conductor that is substantially thicker than said wiring patterns and is interposed between respective ones of the layers of the circuit board structure intermediate said layers having the surfaces along which the first and second transmission lines extend, said electrical ground conductor having a through-hole in which said signal line resides as spaced from the ground conductor; and a dielectric medium occupying said through-hole and substantially circumferentially surrounding said signal line, wherein said ground conductor and said dielectric medium form a coaxial structure in the vertical direction.

2. The electrical interconnect according to claim 1, wherein said circuit board structure consists of a single multi-layer printed circuit board in which said ground conductor is integrated.

3. The electrical interconnect according to claim 1, wherein said circuit board structure comprises first and second discrete printed circuit boards between which said ground conductor is sandwiched.

4. The electrical interconnect according to claim 1, wherein said dielectric medium is a volume of air.

5. The electrical interconnect according to claim 2, wherein said dielectric medium is a volume of air.

6. The electrical interconnect according to claim 3, wherein said dielectric medium is a volume of air.

7. The electrical interconnect according to claim 1, wherein said ground conductor is in contact with the wiring pattern of at least one of said respective layers.

8. The electrical interconnect according to claim 1, wherein said electrical ground conductor has a thickness, in the vertical direction, that is substantially the same as that of the layers of the circuit board structure.

9. The electrical interconnect according to claim 1, wherein said electrical ground conductor has a thickness in the vertical direction of approximately 80 mm.

10. The electrical interconnect according to claim 8, wherein said thickness is approximately 80 mm.

* * * * *